(12) United States Patent
Derluyn et al.

(10) Patent No.: US 9,991,346 B2
(45) Date of Patent: Jun. 5, 2018

(54) SEMICONDUCTOR STRUCTURE COMPRISING AN ACTIVE SEMICONDUCTOR LAYER OF THE III-V TYPE ON A BUFFER LAYER STACK AND METHOD FOR PRODUCING SEMICONDUCTOR STRUCTURE

(71) Applicant: EPIGAN NV, Hasselt (BE)

(72) Inventors: Joff Derluyn, Sint-Joris-Weert (BE); Stefan Degroote, Scherpenheuvel-Zichem (BE)

(73) Assignee: EPIGAN NV, Hasselt (BE)

( * ) Notice: Subject to any disclaimer, the term of this patent is extended or adjusted under 35 U.S.C. 154(b) by 0 days. days.

(21) Appl. No.: 15/501,923

(22) PCT Filed: Jul. 22, 2015

(86) PCT No.: PCT/EP2015/066785
§ 371 (c)(1),
(2) Date: Feb. 6, 2017

(87) PCT Pub. No.: WO2016/020196
PCT Pub. Date: Feb. 11, 2016

(65) Prior Publication Data
US 2017/0229549 A1   Aug. 10, 2017

(30) Foreign Application Priority Data
Aug. 4, 2014 (EP) ..................... 14179690

(51) Int. Cl.
*H01L 29/205* (2006.01)
*H01L 29/66* (2006.01)
(Continued)

(52) U.S. Cl.
CPC ........ *H01L 29/205* (2013.01); *H01L 21/0251* (2013.01); *H01L 21/0254* (2013.01);
(Continued)

(58) Field of Classification Search
CPC ......... H01L 21/02381; H01L 21/02458; H01L 21/02505; H01L 21/0251; H01L 21/0254;
(Continued)

(56) References Cited

U.S. PATENT DOCUMENTS

2007/0045639 A1* 3/2007 Kato ................. H01L 21/02381
257/94
2008/0217645 A1 9/2008 Saxler et al.
(Continued)

FOREIGN PATENT DOCUMENTS

EP   2525417 A2   11/2012
EP   2565907 A1   3/2013
(Continued)

OTHER PUBLICATIONS

European Communication for corresponding European Application No. 14179690.4, dated Nov. 2, 2016.
(Continued)

*Primary Examiner* — Cheung Lee
*Assistant Examiner* — Stephen C Smith
(74) *Attorney, Agent, or Firm* — Workman Nydegger

(57) ABSTRACT

A semiconductor structure includes a buffer layer stack comprising a plurality of III-V material layers, and the buffer layer stack includes at least one layered substructure. Each layered substructure comprises a compressive stress inducing structure between a respective first buffer layer and a respective second buffer layer positioned higher in the buffer layer stack than the respective first buffer layer. A lower surface of the respective second buffer layer has a lower Al content than an upper surface of the respective first buffer layer. An active semiconductor layer of the III-V type is provided on the buffer layer stack. The surface of the respective relaxation layers is sufficiently rough to inhibit the relaxation of the respective second buffer layer, and
(Continued)

comprises a Root Mean Square (RMS) roughness larger than 1 nm. A method is provided for producing the semiconductor structure.

19 Claims, 7 Drawing Sheets

(51) Int. Cl.
*H01L 21/02* (2006.01)
*H01L 29/778* (2006.01)
*H01L 29/20* (2006.01)
*H01L 29/06* (2006.01)

(52) U.S. Cl.
CPC .... *H01L 21/0262* (2013.01); *H01L 21/02381* (2013.01); *H01L 21/02458* (2013.01); *H01L 21/02505* (2013.01); *H01L 29/0688* (2013.01); *H01L 29/2003* (2013.01); *H01L 29/66462* (2013.01); *H01L 29/7787* (2013.01)

(58) Field of Classification Search
CPC .............. H01L 21/0262; H01L 29/205; H01L 29/0688; H01L 29/2003; H01L 29/66462; H01L 29/7787
See application file for complete search history.

(56) References Cited

U.S. PATENT DOCUMENTS

| | | | |
|---|---|---|---|
| 2014/0045284 A1* | 2/2014 | Tak | H01L 21/02381 438/27 |
| 2014/0138699 A1* | 5/2014 | Hikosaka | H01L 21/0254 257/76 |
| 2014/0361345 A1* | 12/2014 | Kaneko | H01L 29/2003 257/200 |

FOREIGN PATENT DOCUMENTS

| | | |
|---|---|---|
| EP | 2696365 A2 | 2/2014 |
| WO | 0213242 A1 | 2/2002 |

OTHER PUBLICATIONS

Extended European Search Report for corresponding European Application No. 14179690.4, dated Jan. 14, 2015.
International Preliminary Report on Patentability for corresponding International PCT Application No. PCT/EP2015/066785, dated Oct. 27, 2016.
International Search Report for corresponding International PCT Application No. PCT/EP2015/066785, dated Sep. 24, 2015.
Li et al., "Challenge of III-V Materials Integration with Si Microelectronics," III-V Compound Semiconductors: Integration with Silicon-Based Microelectronics, Chapter 2, Jan. 2011, pp. 51-96, CRC Press, Boca Raton, Florida.

* cited by examiner

SEMICONDUCTOR STRUCTURE COMPRISING AN ACTIVE SEMICONDUCTOR LAYER OF THE III-V TYPE ON A BUFFER LAYER STACK AND METHOD FOR PRODUCING SEMICONDUCTOR STRUCTURE

TECHNICAL FIELD

The present invention relates to a semiconductor structure comprising a buffer layer stack comprising a plurality of III-V material layers, and an active semiconductor layer of the III-V type, e.g. a GaN layer, provided on the buffer layer stack, the buffer layer stack being provided on a substrate. The present invention also relates to methods for producing such a semiconductor structure.

BACKGROUND ART

Gallium nitride materials are semiconductor compounds that have a relatively wide, direct band gap. These electronic transitions provide gallium nitride materials with a number of attractive properties, for instance the ability to withstand a high electrical field, to transmit signals at high frequency, and others. Gallium nitride materials are therefore being widely investigated in many microelectronic applications such as transistors, field emitters, and optoelectronic devices. Gallium nitride materials include gallium nitride (GaN) and its alloys such as aluminum gallium nitride (AlGaN), indium gallium nitride (InGaN), and aluminum indium gallium nitride (AlInGaN).

Most GaN epilayers are grown on foreign substrates such as sapphire ($Al_2O_3$), SiC or Si, because native GaN substrates are hard to make and as a result very expensive. These substrates have different structural and mechanical properties compared to the (In)(Al)GaN epilayers, for instance they comprise different thermal expansion coefficients or different lattice constants. This results in serious strain build-up in the GaN epilayer, which increases as the epilayer thickness increases.

In the prior art, a layered buffer structure is therefore introduced between the substrate and the active part of the device. This buffer structure accommodates as much as possible the effect of the difference between the properties of the substrate material and the materials that are used in the active part of the layers. Such differences may include but are not limited to, a difference in lattice constant, a difference in thermal expansion coefficient, a different crystal structure, a different band gap energy and resulting dielectric breakdown strength. This buffer layer ideally does not influence the properties of the active part or device, but could have minor functionality in the final device for instance as contacting layer, or alternatively as current blocking layer.

The active part of a layer stack is the part of the structure that directly determines the properties of the device that will be manufactured on the layer stack. For example, the active part of an AlGaN/GaN HEMT structure typically consists of a relatively thick (>100 nm) GaN channel layer with a thin (about 20 nm thick) AlGaN barrier layer on top. In such a HEMT, the threshold voltage, transconductance and for a part the on-state resistance are directly determined by the composition and thickness of an AlGaN barrier layer. In an LED for example, the composition and thickness of the quantum well and barriers determine the wavelength of the emitted light. The design and the choice of materials in the active part is optimized for the best device performance, and as little as possible dependent on constraints that are imposed by the choice of substrate or buffer structure.

In GaN on Si technology, almost always an additional nucleation layer is introduced between the substrate on the one hand and the buffer structure and active part on the other hand. This layer can be an AlN layer because the Gallium in AlGaN or GaN layers causes etch-back of the Si substrate. In some cases a dielectric layer is deposited on the substrate to mitigate this effect (e.g. SiC on Si, diamond in Si, etc.). The term "AlGaN" relates to a composition comprising Al, Ga and N in any stoichiometric/compositional ratio ($Al_xGa_{1-x}N$), which composition may vary in layer, e.g. from having no Ga at a bottom of the layer to having no Al at a top of the layer. A composition such as (In)AlGaN may further comprise Indium (In) an any suitable amount.

The buffer structure typically consists of a plurality of layers. In GaN on Si technology, the composition of the buffer layers will generally evolve from Al-rich layers in the vicinity of the AlN nucleation layer towards Ga-rich layers in the vicinity of the active part that typically comprises one or more GaN layers. The compositional variation from nucleation layer to active part can be done in various ways.

In case of GaN on silicium technology, the buffer structure should compensate for the tensile stress that is induced in the layer stack during the cool-down from the operating temperature during epitaxial deposition of the layer stack to room temperature. Typically, this is done by choosing the layers in the buffer structure such that the combination of these layers introduces compressive stress in the layers at the growth temperature. For instance, depositing a second AlGaN layer with lower Al-concentration on top of a first thick and relaxed AlGaN layer with higher Al-concentration will induce compressive stress because the larger lattice constant of the second layer will be compressed to match the smaller lattice constant of the first layer below.

For instance, in WO0213245 a use of a buffer structure is disclosed.

There exists an industrial need for improving buffer structures such that they compensate for the tensile stress that is induced in the layer stack during the cool-down from the operating temperature during epitaxial deposition of the layer stack to room temperature.

SUMMARY OF THE DISCLOSURE

According to a first aspect of the present invention, semiconductor structure is disclosed comprising a buffer layer stack comprising (or consisting of) a plurality of III-V material layers, the buffer layer stack comprising at least one (or at least two, or at least three; for instance one, two, three or four) layered substructure(s), each layered substructure comprising a compressive stress inducing structure between a respective first buffer layer and respective second buffer layer positioned higher (above) in the buffer layer stack than the respective first buffer layer, a lower surface of the respective second buffer layer having a lower Al content than an upper surface of the respective first buffer layer; and an active semiconductor layer of the III-V type provided on the buffer layer stack.

The content of an element in a layer, for instance Aluminium, is defined as the ratio between the number of Aluminium atoms in the layer on the one hand and the total number of all group III atoms in the layer on the other hand. With Al being member of the group III, this means this ratio is larger than or equal to zero, and smaller than or equal to one.

According to preferred embodiments, the active semiconductor layer of the III-V type comprises a GaN type of layer. According to preferred embodiments, the active semiconductor layer is a lower layer of an active part of a layer stack. According to preferred embodiments, the active part of the layer stack comprises a GaN channel layer and an AlGaN electron-inducing barrier layer.

According to preferred embodiments, the semiconductor structure further comprises a silicon base wafer, the buffer layer stack being separated from the silicon base wafer by means of an AlN nucleation layer which is in direct contact with the silicon base wafer and the buffer layer stack. According to preferred embodiments, a total thickness of the nucleation layer is within the range between 10 nm and 200 nm.

According to preferred embodiments, the buffer layer stack has an upper buffer layer and a lower buffer layer, the lower buffer layer being in direct contact with the AlN nucleation layer and the upper buffer layer being in direct contact with the active layer. According to preferred embodiments, a total thickness of the buffer layer stack is within the range between 500 nm and 10 µm. The layers of the buffer layer stack are preferably all (In)AlGaN layers.

According to preferred embodiments, the compressive stress inducing layered structure, or each of the compressive stress inducing layered structures, comprises a pseudomorphic planarization layer near its lower surface and a relaxation layer near its upper surface (on top of/above the planarization layer), the Al content of the lower surface of the planarization layer being equal to or lower than the Al content of the upper surface of the respective first buffer layer and the Al content of the upper surface of the planarization layer being lower than the Al content of a lower surface of the relaxation layer, and the Al content of an upper surface of the relaxation layer being higher than the Al content of the respective second buffer layer.

According to preferred embodiments, the respective planarization layer and relaxation layer of the layered substructure(s) are in direct contact. According to preferred embodiments, the transition between the pseudomorphic planarization layer and the relaxation layer of the layered substructure(s) is abrupt or discontinuous in respect of Al content. According to preferred embodiments, the transition between the pseudomorphic planarization layer and the relaxation layer of the layered substructure(s) is abrupt or discontinuous in respect of Al content. According to preferred embodiments, the transition between the pseudomorphic planarization layer and the relaxation layer of the layered substructure(s) is more than 10% or more than 20% or more than 50% in respect of Al content.

According to preferred embodiments, the Al content of the respective first buffer layers is within the range of 15% to 100%. More preferably it is within the range of 40 to 70%.

According to preferred embodiments, the thickness of the respective first buffer layers is within the range of 50 nm to 2 microns. More preferably it is within the range of 350 to 1 micron.

According to preferred embodiments, the Al content of the respective second buffer layers is within the range of 0 and 40%. More preferably it is within the range of 8 to 40%.

According to preferred embodiments, a thickness of the respective second buffer layers is within the range of 50 nm to 8 microns. More preferably it is within the range of 500 nm to 4 micron.

The respective first buffer layers and second buffer layers preferably comprise (In)AlGaN layers.

According to preferred embodiments, the respective planarization layers have an Al content within the range of 0 to 20%. According to preferred embodiments, at least one, a plurality or all of the respective planarization layers have an Al content of 0%, i.e. do not comprise Aluminium.

According to preferred embodiments, the Al content of the respective planarization layer is constant for at least one (or for a plurality or for all) layered sub structure.

According to preferred embodiments, the planarising layer is a GaN layer for at least one (or for a plurality or for all) layered substructure.

According to preferred embodiments, a thickness of the respective planarization layers is within the range of 5 nm to 50 nm.

According to preferred embodiments, the respective relaxation layers have a Al content within the range of 50 to 100%.

According to preferred embodiments, wherein the Al content of the relaxation layer of at least one (or for a plurality or for all) layered substructure is constant.

According to preferred embodiments, the relaxation layer is a AlN layer for at least one (or for a plurality or for all) layered substructure.

According to preferred embodiments, a thickness of the respective relaxation layers is within the range of 0.28 nm to 50 nm, more preferably within the range of 1 nm to 10 nm. Preferably, the thickness of the respective relaxation layers is larger than 1 nm, or larger than 2 nm, or larger than 5 nm.

According to preferred embodiments, the surface of the relaxation layer is sufficiently rough to inhibit the relaxation of the respective second buffer layer. Preferably, the RMS (Root Mean Square) roughness of the relaxation layer is larger than 1 nm. Preferably, the RMS roughness of the relaxation layer is within the range of 1 nm to 10 nm.

According to preferred embodiments, the buffer layer stack is composition graded having a higher Al content at its lower surface which decreases monotonously towards the active semiconductor layer, except for the compressive stress inducing structures.

According to a second aspect of the present invention, a method is disclosed for producing a semiconductor structure comprising:
  growing a buffer layer stack comprising (consisting of) a plurality of III-V material layers on a substrate;
  growing an active semiconductor layer of the III-V type provided on the buffer layer stack;
  wherein growing the buffer layer stack comprises at least once growing a layered substructure, wherein growing a layered substructure comprises growing a first buffer layer, a compressive stress inducing structure on top of the first buffer layer, and growing a second buffer layer on top of the compressive stress inducing structure, hereby providing a lower Al content at a lower surface of the respective second buffer layer than at an upper surface of the respective first buffer layer.

According to preferred embodiments, the method comprises providing a silicon base wafer, growing an AlN nucleation layer on the silicon base wafer and growing the buffer layer stack on the AlN nucleation layer.

According to preferred embodiments, growing the buffer layer stack comprises growing the buffer layer stack such that it is composition graded (e.g. preferably step graded, but may be also continuously graded), having a higher Al content at its lower surface which decreases monotonously towards the active semiconductor layer, except at layers constituting the compressive stress inducing structures.

According to preferred embodiments, growing a respective compressive stress inducing layered structure comprises growing a respective pseudomorphic planarization layer on the respective first buffer layer and growing a respective, initially pseudomorphic, relaxation layer on the planarization layer, the Al content of a lower surface of the respective planarization layer being lower or equal to than the Al content of the upper surface of the respective first buffer layer and the Al content of an upper surface of the respective planarization layer being lower than the Al content of a lower surface of the respective relaxation layer, and the Al content of an upper surface of the respective relaxation layer being higher than the Al content of the respective second buffer layer.

According to preferred embodiments, growing the relaxation layer(s) is performed at a temperature which is larger than 1100° C., or larger than 1200° C. Growing the relaxation layer(s) at these temperatures results in an increased RMS roughness, e.g. larger than 1 nm. This provides the advantage that the relaxation of the respective second buffer layer provided on top of the relaxation layer is inhibited. The second buffer layer that is grown pseudomorphically on top will then comprise a high level of or maximized in-plane compressive strain.

Features and advantages as explained for embodiments of the first aspect of the present invention are applicable to the second aspect of the present invention, and vice versa, mutatis mutandis.

For the purpose of the present disclosure, whenever ranges are defined, it is intended to disclose these ranges in their closed, open, and two half open forms. All these options are meant to be disclosed even if the term "between" is used in the context of defining such ranges.

Advantages of the present invention are detailed throughout the description.

DETAILED DESCRIPTION OF PREFERRED EMBODIMENTS

Figure 1:
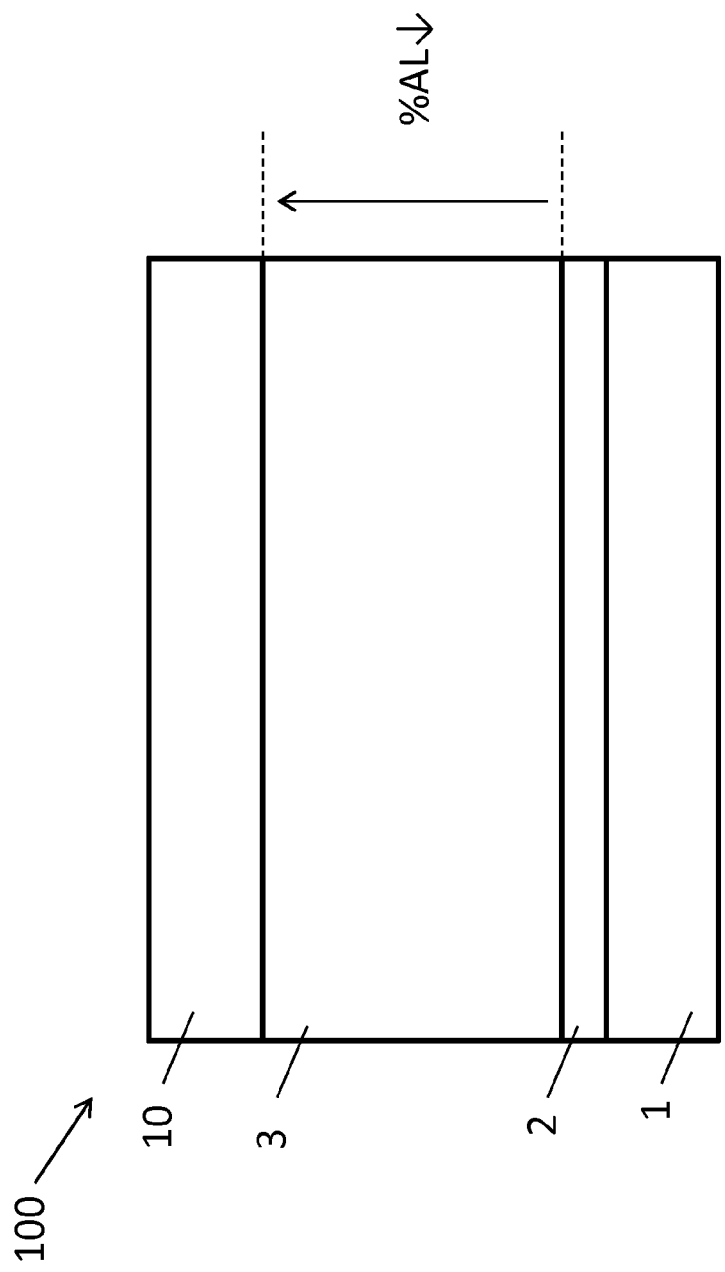
FIG. 1 illustrates a prior art semiconductor structure comprising a buffer layer stack.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as exemplary manners in which the disclosure may be implemented rather than as limiting the scope of the disclosure.

FIG. 1 illustrates a prior art semiconductor structure 100 comprising a buffer layer stack 3 comprising a plurality of III-V material layers, and an active semiconductor layer 10 of the III-V type provided on the buffer layer stack. The active semiconductor layer 10 is for instance the lower layer of the active part of the layer stack. The buffer layer stack 3 is separated from a silicon base wafer by means of a AlN nucleation layer 2 which is in direct contact with the silicon base wafer 1 and the buffer layer stack 3. The buffer structure or buffer layer stack 3 typically consists of a plurality of layers. In GaN-on-Si technology, the composition of the buffer layers will generally evolve from Al-rich layers in the vicinity of the AlN nucleation layer towards Ga-rich (and relatively Al-poor) layers in the vicinity of the active semiconductor layer 10, for instance a GaN layer 10. The compositional variation of the buffer layer 3 from nucleation layer 2 to active part 10 can be done in various ways known to the skilled person. The compositional variation can for instance comprise a stepwise or continuous grading of the Al content of the buffer layer 3.

In case of GaN on silicium technology, the buffer layer stack or buffer structure should compensate for the tensile stress that is induced in the layer stack during the cool-down from the operating temperature during epitaxial deposition of the layer stack to room temperature.

It was found that layers with high Aluminium concentration (for instance Al % larger than 50%) in a typical buffer layer stack 3 may suffer from significant surface roughness. Furthermore, in the prior art case of the first and second buffer layers being step graded in Aluminium content, the second buffer layer (subsequent step) having a lower Al content than the first buffer layer (previous step), in-plane compressive stress is induced during the pseudomorphic growth of the first grown part of the second buffer layer. As the growing second buffer layer relaxes, it starts to assume its own unstrained lattice constant, which reduces and finally stops the build-up of compressive stress.

In aspects of the present invention, the compressive stress generation is further increased by including at least one compressive stress inducing structure 5 preferably comprising two layers within a buffer layer stack 3 between a first buffer layer 40 and second buffer layer 41 positioned higher in said buffer layer stack than said respective first buffer layer 40. This compressive stress inducing structure 5 preferably comprises two layers; a planarisation layer 6 and a relaxation layer 8. The layered substructure 4 comprises the compressive stress inducing structure 5 between the first buffer layer 40 and second buffer layer 41 positioned higher in said buffer layer stack than said respective first buffer layer 40. Preferably the lower surface of the second buffer layer 41 has a lower Al content than the upper surface of the first buffer layer 40.

Figure 2:
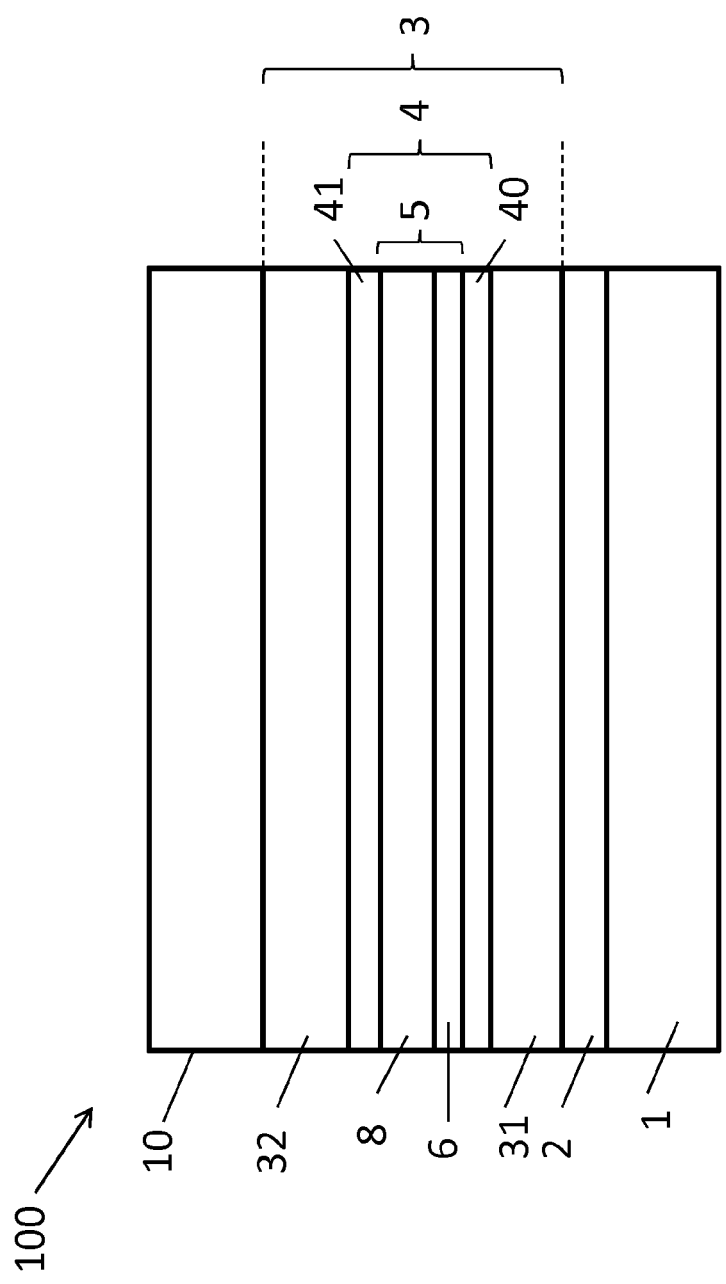
FIG. 2 illustrates a buffer layer stack according to a preferred embodiment of the present invention.

Such a preferred embodiment of the present invention for the buffer layer stack 3 (31, 4 (40, 5 (6, 8), 41), 32) is depicted in FIG. 2. A silicon substrate 1 is provided on which an AlN nucleation layer 2 is grown. The buffer layer stack 3 is grown on top of the AlN nucleation layer 2, comprising a lower portion 31, a layered structure 4 and an upper portion 32. On the buffer layer stack 3, an active semiconductor layer 10 of the III-V type is provided, for instance a GaN layer.

The planarisation layer 6 reduces the surface roughness of the first buffer layer 40. It is preferably grown in such conditions (e.g. suitably low temperature (for instance smaller than 1250° C., or smaller than 1200° C., or smaller than 1100° C.; and preferably also larger than 900° C.) and high growth rate) that it does not relax (its lattice constant hereby assumes the value of the lattice constant of the first buffer layer 40 and so the layer is grown pseudo-morphically on top of the first buffer layer). Also, the thickness of the planarisation layer 6 is kept low (e.g. a thickness between 5 and 50 m) to avoid exceeding the critical thickness after which relaxation starts to occur. To promote planarisation, the layer is Ga-rich, i.e. the Al-concentration of the planarisation layer is kept as low as possible (e.g. a pure GaN layer, not comprising any Al). The planarity of this layer 6 ensures that the first part, i.e. the part first grown, of the relaxation layer 8 is pseudo-morphic (has the same in-plane lattice constant) to the planarisation layer 6 and first buffer layer 40.

The relaxation layer 8 is grown on top of the planarisation layer 6. The relaxation layer 8 is grown in such conditions that, even though the first part of the layer is grown pseudomorphically, relaxation occurs as fast as possible. Ideally, the top of the relaxation layer is fully relaxed, but in some cases it can also be only partially relaxed. The relaxation may for example occur through the generation of misfit dislocations or through the roughening of the surface. Indeed, a high temperature is used (for instance larger than 1100° C. or larger than 1200° C.) and a large difference in lattice constant is used for the relaxation layer 8 when compared to the planarisation layer 6 (for instance the difference in Al content (Al %) may be larger than 50%). The relaxation layer 8 preferably is Al-rich, i.e. it has an as high as possible Al-content (i.e. as low as possible lattice constant) such that it has a surface that inhibits the relaxation of the second buffer layer, for instance such that it has a surface which is sufficiently rough (e.g. having a RMS roughness larger than 1 nm), and such that the second buffer layer that is grown pseudomorphically on top contains as much as possible in-plane compressive strain. Preferably, it is an AlN layer. Additionally relaxation may be promoted by intentionally introducing growth interrupts or varying precursor and ambient gas partial pressures. Even though increasing the thickness of the relaxation layer may be beneficial for promoting relaxation, it is best to keep it relatively thin to avoid the build-up of too much tensile stress.

The second buffer layer is grown on top of the relaxation layer. Because it has a lower Al content than the relaxation layer, compressive stress will be built up for as long as the second buffer layer is not fully relaxed. The occurrence of relaxation in this layer is a function of growth conditions (lower growth temperature, high growth rate), which can be controlled, and of the planarity of the layer on top of which it is grown.

Figure 3:
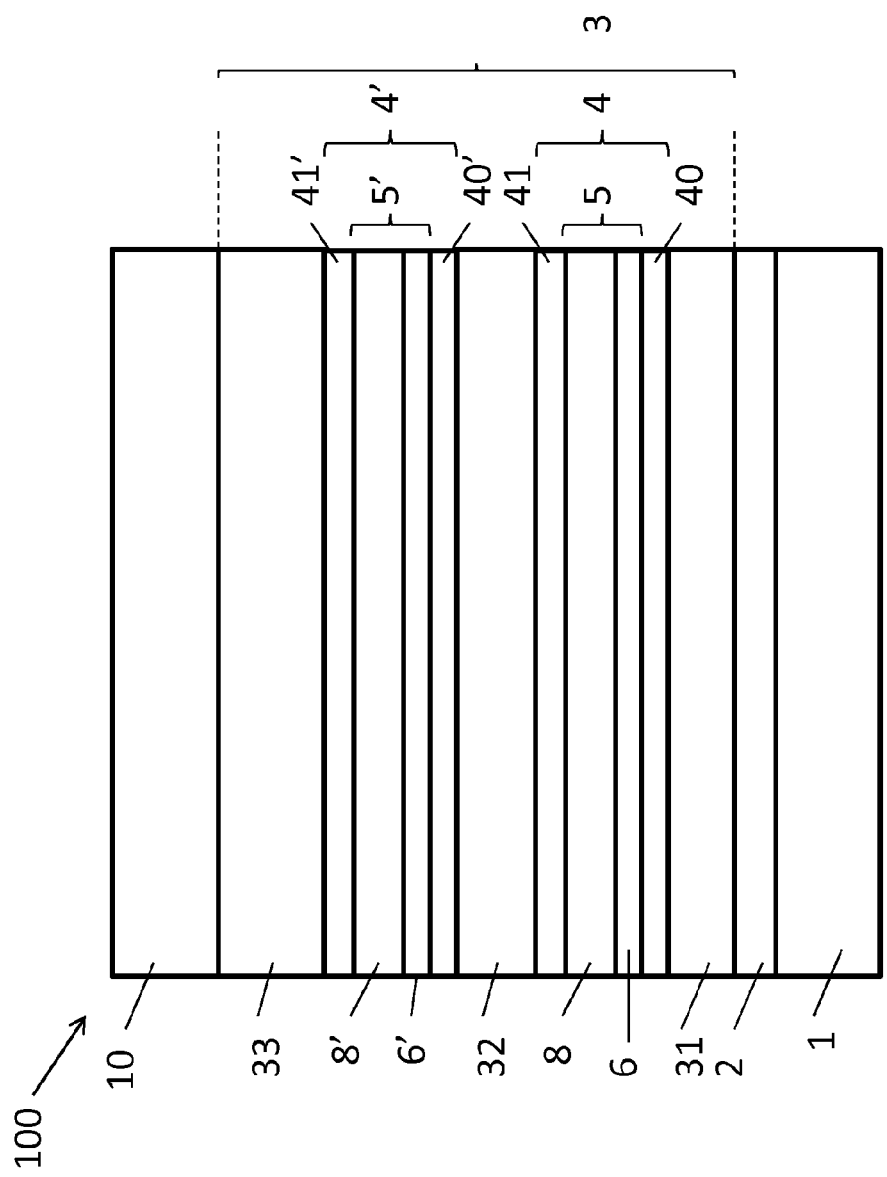
FIG. 3 illustrates a buffer layer stack according to another embodiment of the present invention.

FIG. 3 illustrates a further preferred embodiment of the present invention, which is similar to the embodiment described in relation with FIG. 2, but in which two layered substructures (4,4') are grown within the buffer layer stack 3. The buffer layer stack comprises, from bottom to top, a lower portion 31, a first substructure 4, a middle portion 32, a second substructure 4', and upper portion 33. The second substructure 4' is positioned higher in the buffer layer stack 3 than the first substructure and is similar to the first substructure 4. The second substructure 4' can be separated from the first substructure 4 by means of a buffer layer stack portion 32. Alternatively the layers 41 and 40' can be the same layer. The second substructure 4' comprises a first buffer layer 40', a compressive stress inducing layered structure (CSIS) 5' grown on the first buffer layer 40', and a second buffer layer 41' grown on the compressive stress inducing structure 5'. The compressive stress inducing structure 5' comprises a planarization layer 6' grown on the first buffer layer 40' and a relaxation layer 8' grown on the planarization layer 6'. The properties of the second substructure are similar to those described for the first substructure. The first and second substructure can be the same or can be different.

According to preferred embodiments, a plurality of these substructures (4, 4', 4'', 4''', ... ) can be grown in the buffer layer stack 3, as the skilled person will recognize. For instance there can be two, three, four, five or more substructures. The more substructures there are present in the buffer layer stack 3, the more compressive stress can be introduced.

According to preferred embodiments, the buffer layer stack 3 is composition graded having a higher Al content at its lower surface which decreases monotonously, continuously or stepwise, towards the active semiconductor layer 10, except for the compressive stress inducing structures 4, 4', 4'' .... In other words, a virtual stack comprising the portions of the buffer layer stack 40, 41, 40', 41', 31, 32, 33 which are not part of the CSIS 5, 5', can be composition graded having a higher Al content at its lower surface which decreases monotonously, continuously or stepwise, towards it upper surface.

The growth of the nucleation layer 2, layers of the buffer layer stack 3 and the active layer 10 are preferably performed by MOCVD, or MBE, or HVPE or CBE. According to a preferred embodiment, the layers are grown using MOCVD. For instance, a silicon (Si) substrate is introduced into the MOCVD reactor chamber. The reactor has a controlled ambient gas flow (of e.g. hydrogen and/or nitrogen), and is kept at a well-controlled pressure and at a well-controlled temperature. Measures should be taken to avoid the presence of contaminants in the reactor chamber. The substrate is heated to an elevated temperature (e.g. above 1000° C.) in a hydrogen ambient to remove the native oxide. Subsequently, controlled gas flows of a nitrogen precursor (e.g. NH3) and an Al precursor (e.g. TMAl) are introduced into the reactor either at the same time or in a specific switching sequence to commence the growth of the AlN nucleation layer. When the growth of the nucleation layer is finished, the buffer layers stack is grown, e.g by introducing precursors for Al (e.g. TMAl), Ga (e.g. TMGa), and nitrogen (e.g. NH3). On top of the buffer stack, the active part is grown. After the growth, the substrate is cooled down to a suitable handling temperature upon which the substrate with III-N layer stack on top can be removed from the reactor chamber and further processed.

The build-up of stress though the semiconductor structure is described in the FIGS. 4 to 7.

Stress is building up when during pseudomorphic growth, a growing layer assumes an in-plane lattice constant of another (underlying) layer. Depending on the difference between the effective in-plane lattice constant of the growing layer and its natural lattice constant (i.e. the lattice constant of an unstrained "bulk" layer), local in-plane strain is induced.

In embodiments of the present invention, first compressive stress is induced by growing a pseudomorphic lower Al-concentration planarisation layer 6. This layer is kept rather thin to avoid relaxation. The relaxation layer 8 has high Al-content, so that while it is growing in a strained state on top of the planarisation layer 6, tensile stress is induced. By tuning the growth conditions such that the relaxation occurs as soon as possible, the thickness of this layer 8 can be kept as low as possible so that the tensile stress is more or less compensated by the compressive stress generated in the planarisation layer 6. As soon as the relaxation layer 8 is fully relaxed, no additional tensile stress would be generated even though the layer would gain thickness.

On top of this relaxed relaxation layer 8, the second buffer layer 41 is grown. Because strain generation is now determined by the difference in lattice constants between relaxation layer 8 and second buffer layer 41 (as opposed to the much lower lattice constant difference between a typical state of the art first buffer layer 40 and second buffer layer 41), the amount of compressive stress at this transition can be much larger. Moreover, in preferred embodiments of the present invention, the relaxation of this layer is postponed as much as possible, e.g. by choosing appropriate growth conditions or by growing it on top of a layer with a sufficiently rough surface.

Figure 4:
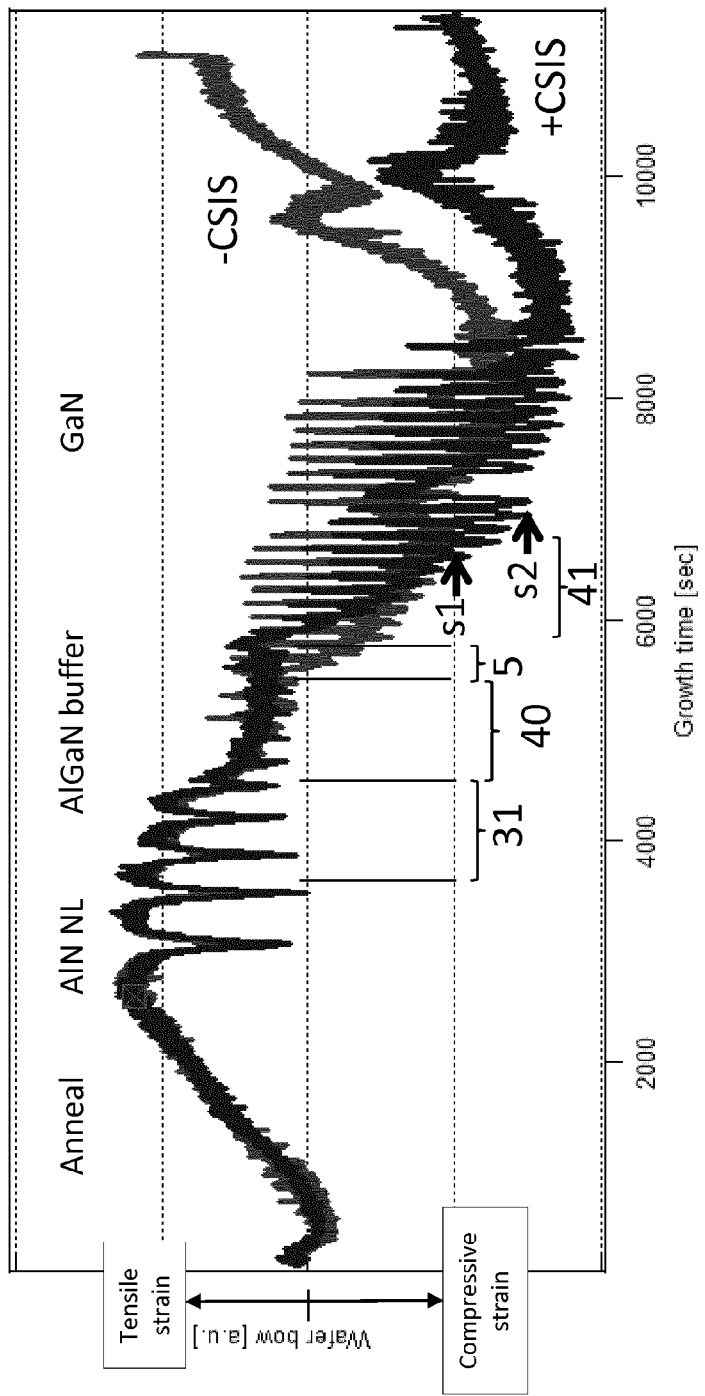
FIG. 4 illustrates the effectiveness of the method and semiconductor structures according to embodiments of the present invention, as compared to the state of the art.

FIG. 4 illustrates the amount of wafer bow as a function of growth time and thus grown layer thickness, which is representative for the strain in the grown layers. The "−CSIS" curve corresponds to the stress build-up for a prior art structure as described in FIG. 1. The "+CSIS" curve corresponds to the stress build-up for a similar structure, which differs from the prior art structure mainly in the presence of a compressive stress inducing structure 5. The process parameters for producing both structures were further substantially identical. It is clear that the use of compressive stress inducing structures 5 according to embodiments of the present invention allows the introduction of much more compressive stress than the prior art solution. Indeed, the +CSIS curve continues falling (stress continues being built up) for a longer time down to a level S2, while the −CSIS curve evolves more quickly to a steady state situation, down to a level S1, whereby the layer is relaxed and no further stress built-up occurs.

Figure 5:
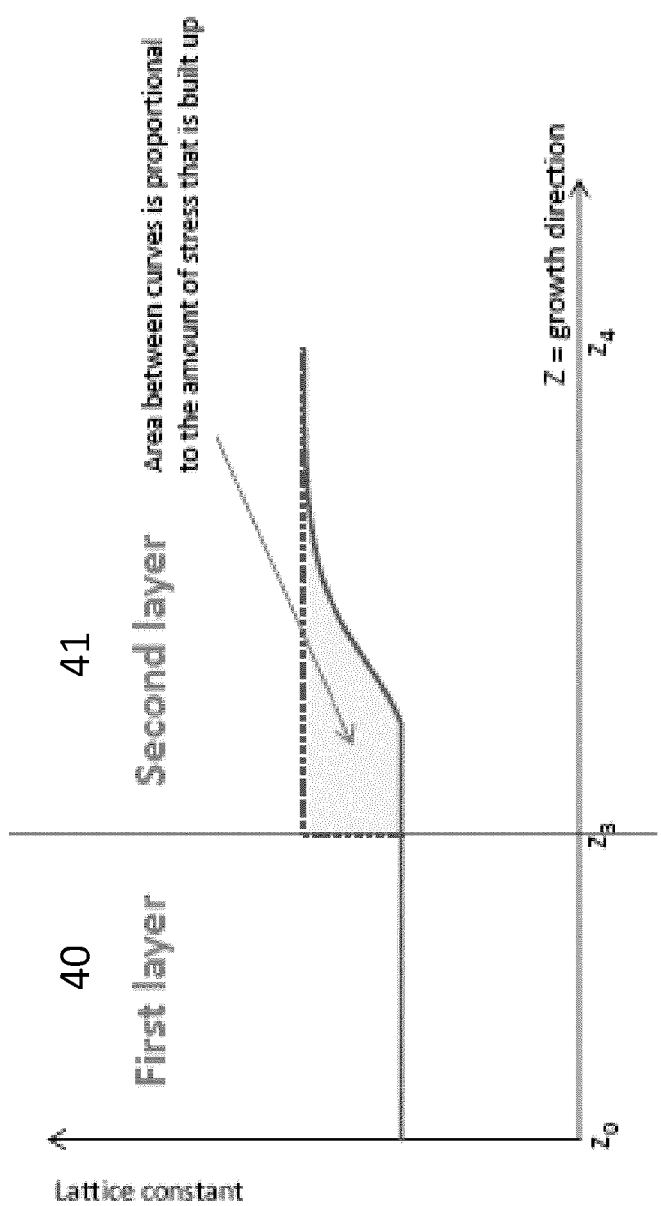
FIG. 5 illustrates the evolution of lattice constant as a function of height level within the layer stack, measured along the growth direction "z" of the stack, for a prior art solution.
Figure 6:
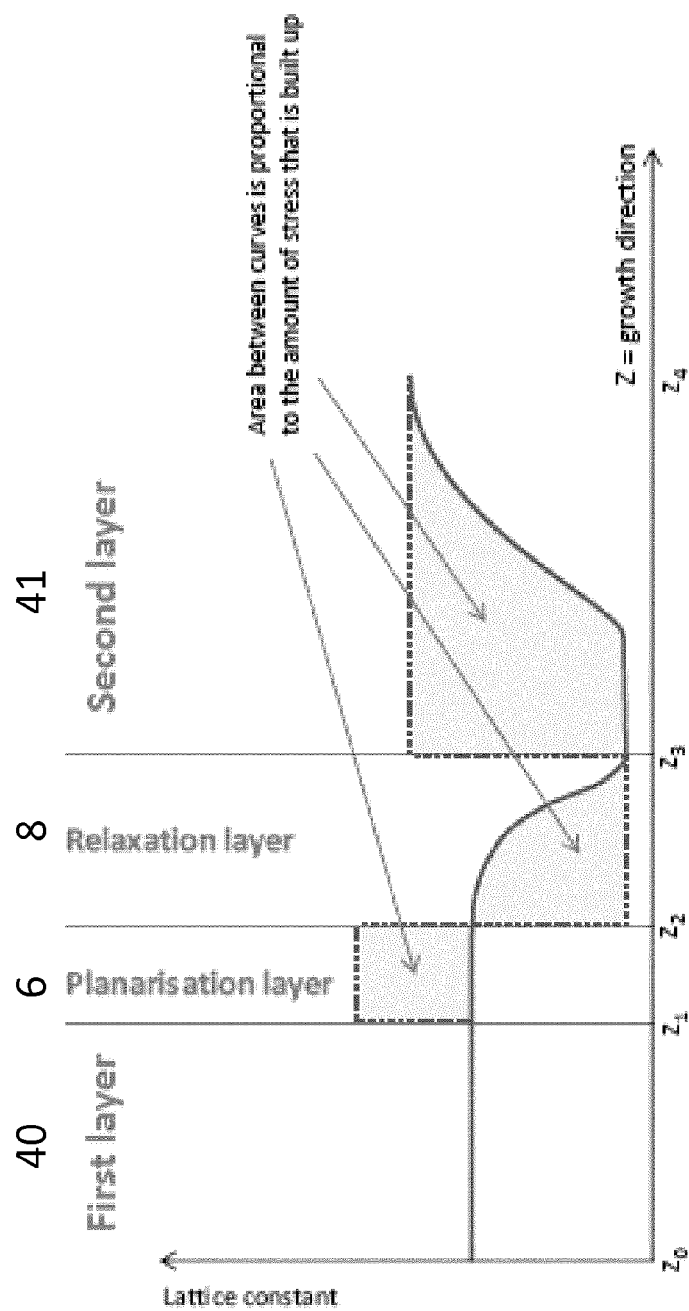
FIG. 6 illustrates the evolution of lattice constant as a function of height level within the layer stack, measured along the growth direction "z" of the stack, for preferred embodiments of the present invention.
Figure 7:
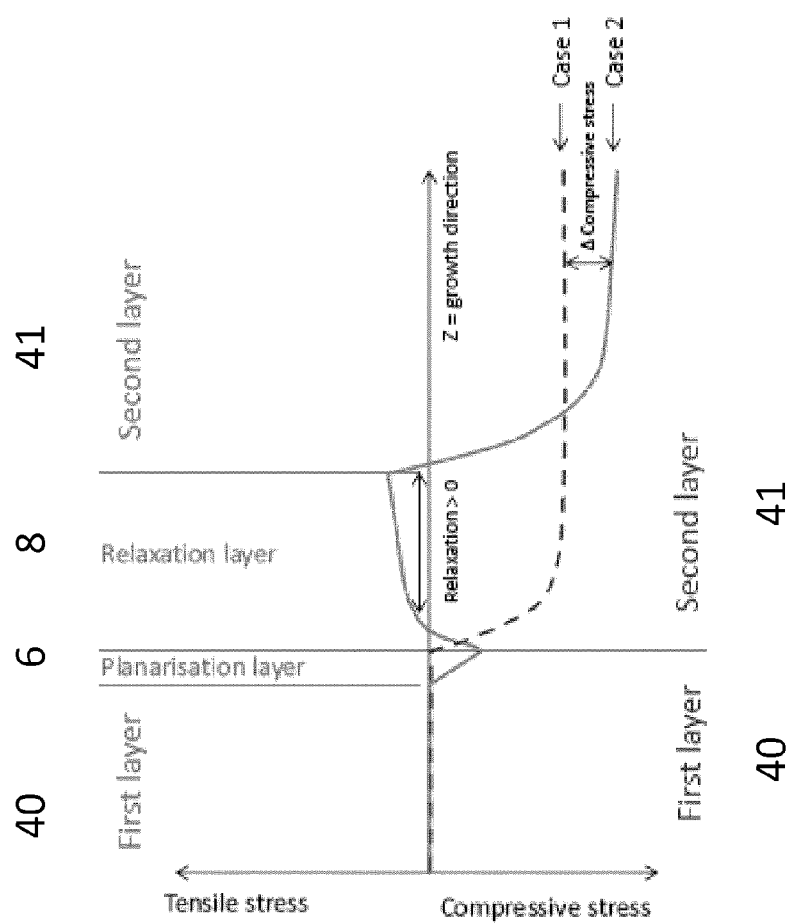
FIG. 7 illustrates the evolution of stress as a function of height level within the layer stack, measured along the growth direction "z" of the stack, for preferred embodiments of the present invention.

FIGS. 5, 6 and 7 are graphs further illustrating the difference between a prior art structure and structures according to embodiments of the present invention.

FIGS. 5 and 6 are illustrating the evolution of lattice constant as a function of layer stack thickness (along the growth direction "z", typically perpendicular on the substrate surface), for two subsequent step-graded layers in a prior art stack (FIG. 5) and for the layered substructure 4 of embodiments of the present invention (FIG. 6). FIG. 5 illustrates the prior art case where a second buffer layer 41 is directly grown on a first buffer layer 40, the second buffer layer 41 having a larger lattice constant (having a lower Aluminium content) than the first buffer layer 40. The indicated area generically illustrates the amount of stress that has been built up in the layer stack. FIG. 6 is the equivalent graph for a structure according to embodiments of the present invention which comprises the compressive stress inducing structure 5 in between the first buffer layer 40 and second buffer layer 41. The indicated areas generically illustrate the amount of stress that is built up in this case, which is much larger than in the prior art structure.

FIG. 7 illustrates the resulting stress evolution as a function of layer stack thickness (along the growth direction "z", typically perpendicular on the substrate surface) for both the prior art stack (dotted line) as well as for the stack according to a preferred embodiment of the present invention (continuous line). It illustrates that the compressive stress induced by a compressive stress inducing structure 5 according to embodiments of the present invention is larger than for the prior art structures.

While the above detailed description has shown, described, and pointed out novel features of aspects of the present invention as applied to various embodiments, it will be understood that various omissions, substitutions, and changes in the form and details of the device or process illustrated may be made by those skilled in the technology without departing from the generic concepts of aspects of the present invention.

The invention claimed is:

1. A semiconductor structure comprising
    buffer layer stack comprising a plurality of III-V material layers, said buffer layer stack comprising at least one layered substructure, each said layered substructure comprising a compressive stress inducing structure between a respective first buffer layer and respective second buffer layer positioned higher in said buffer layer stack than said respective first buffer layer, a lower surface of said respective second buffer layer having a lower Al content than an upper surface of said respective first buffer layer;
    an active semiconductor layer of the III-V type provided on said buffer layer stack;
    wherein each said compressive stress inducing layered structure comprises a pseudomorphic planarization layer near its lower surface and a relaxation layer near its upper surface, the Al content of a lower surface of said planarization layer being lower than or equal to the Al content of said upper surface of said respective first buffer layer and the Al content of an upper surface of said planarization layer being lower than the Al content of a lower surface of said relaxation layer, and the Al content of an upper surface of said relaxation layer being higher than the Al content of said respective second buffer layer; and
    wherein the surface of said respective relaxation layers comprises a Root Mean Square (RMS) roughness larger than 1 nm such that said roughness inhibits the relaxation of the respective second buffer layer.

2. A semiconductor structure according to claim 1, further comprising a silicon base wafer, said buffer layer stack being separated from said silicon base wafer by means of an AlN nucleation layer which is in direct contact with said silicon base wafer and said buffer layer stack.

3. A semiconductor structure according to claim 1, wherein for at least one layered substructure the respective planarization layer and relaxation layer are in direct contact and the transition between said pseudomorphic planarization layer and said relaxation layer is abrupt or discontinuous in respect of Al content.

4. A semiconductor structure according to claim 1, wherein the Al content of the respective first buffer layers is within the range of 15% and 100%.

5. A semiconductor structure according to claim 1, wherein a thickness of said respective first buffer layers is within the range of 50 nm to 2 microns, and wherein a thickness of said respective second buffer layers is within the range of 50 nm to 8 microns.

6. A semiconductor structure according to claim 1, wherein the Al content of the respective second buffer layers is within the range of 0 and 40%.

7. A semiconductor structure according to claim 1, wherein the respective pseudomorphic planarization layers have an Al content within the range of 0 to 20%.

8. A semiconductor structure according to claim 1, wherein the Al content of the respective pseudomorphic planarization layer is constant for at least one layered substructure.

9. A semiconductor structure according to claim 8, wherein said pseudomorphic planarization layer is a GaN layer for at least one layered sub structure.

10. A semiconductor structure according to claim 1, wherein the respective relaxation layers have a Al content within the range of 50 to 100%.

11. A semiconductor structure according to claim 10, wherein said relaxation layer is a AlN layer for at least one layered substructure.

12. A semiconductor structure according to claim 1, wherein a thickness of said respective relaxation layers is within the range of 0.28 nm to 50 nm.

13. A semiconductor structure according to claim 1, wherein said buffer layer stack is composition graded having a higher Al content at its lower surface which decreases monotonously towards the active semiconductor layer, except for said compressive stress inducing structure(s).

14. A semiconductor structure according to claim 13, wherein said buffer layer stack is composition graded having a higher Al content at its lower surface which decreases continuously towards the active semiconductor layer, except for said compressive stress inducing structure(s).

15. A semiconductor structure according to claim 13, wherein said decrease is stepwise.

16. A semiconductor structure according to claim 1, comprising at least two layered substructures.

17. A method for producing a semiconductor structure comprising:
  growing a buffer layer stack comprising a plurality of III-V material layers on a substrate;
  growing an active semiconductor layer of the III-V type provided on said buffer layer stack;
  wherein growing said buffer layer stack comprises at least once growing a layered substructure, wherein growing a layered substructure comprises growing a first buffer layer, a compressive stress inducing structure on top of said first buffer layer, and growing a second buffer layer on top of said compressive stress inducing structure, hereby providing a lower Al content at a lower surface of said respective second buffer layer than at an upper surface of said respective first buffer layer;
  wherein growing a compressive stress inducing structure comprises growing a respective pseudomorphic planarization layer on the respective first buffer layer and growing a respective, initially pseudomorphic, relaxation layer on the planarization layer, the Al content of a lower surface of the respective pseudomorphic planarization layer being lower than or equal to the Al content of the upper surface of the respective first buffer layer and the Al content of an upper surface of the respective pseudomorphic planarization layer being lower than the Al content of a lower surface of the respective relaxation layer, and the Al content of an upper surface of the respective relaxation layer being higher than the Al content of the respective second buffer layer; and
  wherein growing the respective relaxation layers comprises growing, at a temperature larger than 1200° C., a surface of the respective relaxation layers comprising a Root Mean Square (RMS) roughness larger than 1 nm, such that the roughness inhibits the relaxation of the compressive stress in the respective second buffer layers.

18. A method according to claim 17, wherein the step of growing said respective relaxation layer on the planarization layer comprises initially growing said respective relaxation layer pseudomorphically and allowing said respective relaxation layer to relax.

19. A semiconductor structure comprising
  buffer layer stack comprising a plurality of III-V material layers, said buffer layer stack comprising at least one layered substructure, each said layered substructure comprising a compressive stress inducing structure between a respective first buffer layer and respective second buffer layer positioned higher in said buffer layer stack than said respective first buffer layer, a lower surface of said respective second buffer layer having a lower Al content than an upper surface of said respective first buffer layer;
  an active semiconductor layer of the III-V type provided on said buffer layer stack;
  wherein each said compressive stress inducing layered structure comprises a pseudomorphic planarization layer near its lower surface and a relaxation layer near its upper surface, the Al content of a lower surface of said planarization layer being lower than or equal to the Al content of said upper surface of said respective first buffer layer and the Al content of an upper surface of said planarization layer being lower than the Al content of a lower surface of said relaxation layer, and the Al content of an upper surface of said relaxation layer being higher than the Al content of said respective second buffer layer; and
  wherein:
  the respective second buffer layers are grown pseudomorphically on top of the respective relaxation layers, thereby building up compressive stress in the respective second buffer layers; and
  the surface of said respective relaxation layers comprises a Root Mean Square (RMS) roughness larger than 1 nm such that said roughness inhibits the relaxation of the respective second buffer layer.

* * * * *